(12) United States Patent
Tsuchiya et al.

(10) Patent No.: US 11,335,571 B2
(45) Date of Patent: May 17, 2022

(54) SEMICONDUCTOR DEVICE INCLUDING A PACKAGE SUBSTRATE AND A SEMICONDUCTOR CHIP

(71) Applicant: RENESAS ELECTRONICS CORPORATION, Tokyo (JP)

(72) Inventors: Hideaki Tsuchiya, Tokyo (JP); Akira Matsumoto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/930,106

(22) Filed: Jul. 15, 2020

(65) Prior Publication Data

US 2022/0020604 A1  Jan. 20, 2022

(51) Int. Cl.
*H01L 21/56* (2006.01)
*H01L 23/498* (2006.01)
(Continued)

(52) U.S. Cl.
CPC ........ *H01L 21/563* (2013.01); *H01L 23/3114* (2013.01); *H01L 23/49816* (2013.01);
(Continued)

(58) Field of Classification Search
CPC ... H01L 21/563; H01L 23/3114; H01L 24/16; H01L 24/13; H01L 24/05; H01L 24/32;
(Continued)

(56) References Cited

U.S. PATENT DOCUMENTS

| 11,121,071 | B2 * | 9/2021 | Kim | ...................... H01L 23/433 |
| 2004/0149479 | A1 * | 8/2004 | Chiu | .................... H05K 3/3436 |
| | | | | 174/527 |

(Continued)

FOREIGN PATENT DOCUMENTS

WO    2006/064534 A1    6/2006

OTHER PUBLICATIONS

Ming-Che Hsieh et al: "Comprehensive Thermomechanical Analyses and Validations for Various Cu Column Bumps in fcFBGA", IEEE Transactions on Components, Packaging and Manufacturing Technology, IEEE, USA, vol. 3, No. 1, Jan. 1, 2013, pp. 61-70.

(Continued)

*Primary Examiner* — Douglas W Owens
(74) *Attorney, Agent, or Firm* — McDermott Will & Emery LLP

(57) ABSTRACT

A semiconductor device includes a package substrate, a semiconductor chip and a solder bump. The semiconductor chip is disposed on the package substrate. The package substrate includes a first electrode pad, and a first insulating film formed such that the first insulating film exposes a first portion of a surface of the first electrode pad. The semiconductor chip includes a second electrode pad and a second insulating film formed such that the second insulating film exposes a second portion of a surface of the second electrode pad. The second electrode pad is formed on the first electrode pad through the solder bump. L2/L1 is 0.63 or more in a cross section passing through the first electrode pad, the solder bump and the second electrode pad. A first length of the first portion and a second length of the second portion are defined as L1 and L2, respectively.

12 Claims, 16 Drawing Sheets

(51) Int. Cl.
*H01L 23/31* (2006.01)
*H01L 23/00* (2006.01)

(52) U.S. Cl.
CPC .............. *H01L 24/05* (2013.01); *H01L 24/13* (2013.01); *H01L 24/16* (2013.01); *H01L 24/32* (2013.01); *H01L 2224/16225* (2013.01); *H01L 2224/32225* (2013.01)

(58) Field of Classification Search
CPC ..... H01L 23/49816; H01L 2224/16225; H01L 2224/32225
See application file for complete search history.

(56) References Cited

U.S. PATENT DOCUMENTS

| | | | |
|---|---|---|---|
| 2008/0128887 A1* | 6/2008 | Hayashi | .................. H01L 24/10 257/690 |
| 2008/0142968 A1 | 6/2008 | Jadhav et al. | |
| 2018/0294239 A1 | 10/2018 | Sakata et al. | |

OTHER PUBLICATIONS

Extended European Search Report issued in corresponding European Patent Application No. 21183514.5-1212, dated Dec. 21, 2021.

* cited by examiner

SEMICONDUCTOR DEVICE INCLUDING A PACKAGE SUBSTRATE AND A SEMICONDUCTOR CHIP

BACKGROUND

A present disclosure relates to a semiconductor device and, for example, to a semiconductor device including a package substrate and a semiconductor chip electrically connected with each other through a solder bump.

There is a disclosed technique listed below.
[Patent Document 1] WO 2006/064534

As an example of a bonding technique, flip-chip bonding is known (see, for example, Patent Document 1). In a semiconductor device described in Patent Document 1, a package substrate and a semiconductor chip are electrically connected with each other through a solder bump. The solder bump is electrically connected with an electrode pad of the semiconductor chip. The semiconductor device includes an insulating film on which an opening exposing a portion of the electrode pad is formed. The solder bump is connected with the electrode pad via the opening.

In a flip-chip connection step, while the solder bump connected with the electrode pad of the semiconductor chip is disposed on the electrode pad of the package substrate, heat and pressure is applied to the solder bump. Thus, the package substrate and the semiconductor chip are bonded with each other through the solder bump.

SUMMARY

In the semiconductor device, when the current is supplied via the solder bump between the package substrate and the semiconductor chip, Joule heat is generated. Of the solder bump, a portion located in the opening of the insulating film, as compared with a portion located outside the opening, a diameter of the solder bump is small. Therefore, in the portion, of the solder bumps, located in the opening of the insulating film, a current density is locally increased. Thus, the amount of Joule heat generated is increased. Because of the local increase in current density and the amount of Joule heat generated, when a current is supplied from the package substrate to the semiconductor chip, of the solder bump, a void may be generated by electromigration in the vicinity of the semiconductor chip. The degree of the current concentration varies depending on the shape of the opening, and manufacturing variations of the semiconductor device. As a consequence, a lifetime variation of the semiconductor device becomes larger. Thus, there is a room for improving the conventional semiconductor device from the viewpoint of enhancing reliability.

It is a problem of the embodiments to improve the reliability of the semiconductor device. Other problems and novel features will become apparent from the description of the specification and drawings.

A semiconductor device according to the embodiments includes a package substrate, a semiconductor chip disposed on the package substrate, and a solder bump electrically connecting the package substrate and the semiconductor chip with each other. The package substrate includes a first electrode pad, and a first insulating film formed such that the first insulating film exposes a first portion of a surface of the first electrode pad. The semiconductor chip includes a second electrode pad, and a second insulating film formed such that the second insulating film exposes a second portion of a surface of the second electrode pad. The second electrode pad is formed on the first electrode pad through the solder bump. L2/L1 is 0.63 or more in a cross section passing through the first electrode pad, the solder bump and the second electrode pad, when a first length of the first portion and a second length of the second portion are defined L1 and L2, respectively.

In the semiconductor device according to the embodiments, it is possible to improve the reliability of the semiconductor device.

DETAILED DESCRIPTION

Figure 1:
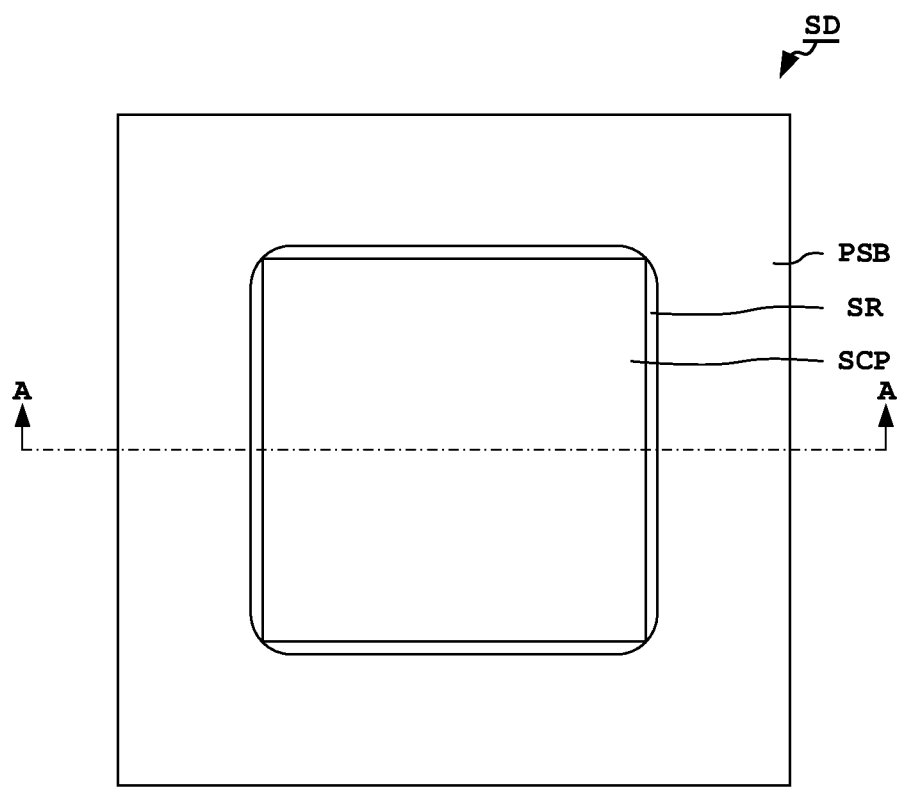
FIG. 1 is a plan view showing an exemplary configuration of a semiconductor device according to an embodiment.

Hereinafter, a semiconductor device according to an embodiment will be described in detail by referring to the drawings. In the specification and drawings, the same or corresponding constituent elements are denoted by the same reference numerals or hatching, and overlapping descriptions are omitted. In the drawings, for convenience of description, a configuration may be omitted or simplified. In addition, a cross-sectional view may be shown as an end view from the viewpoint of visibility.

Configuration of Semiconductor Device

Figure 2:
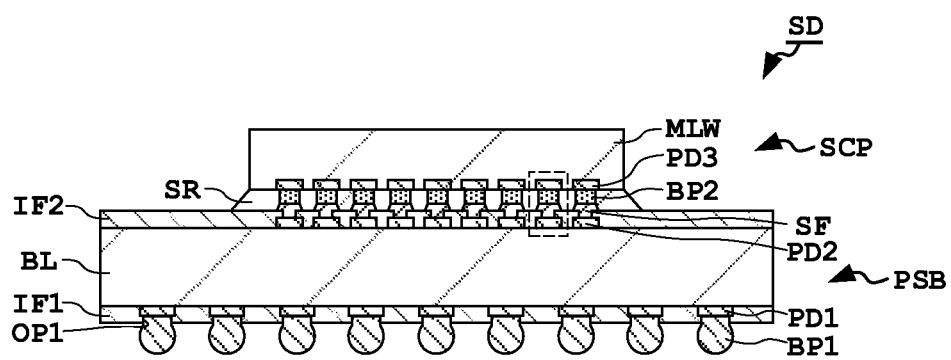
FIG. 2 is a cross-sectional view showing an exemplary configuration of the semiconductor device according to the embodiment.
Figure 3:
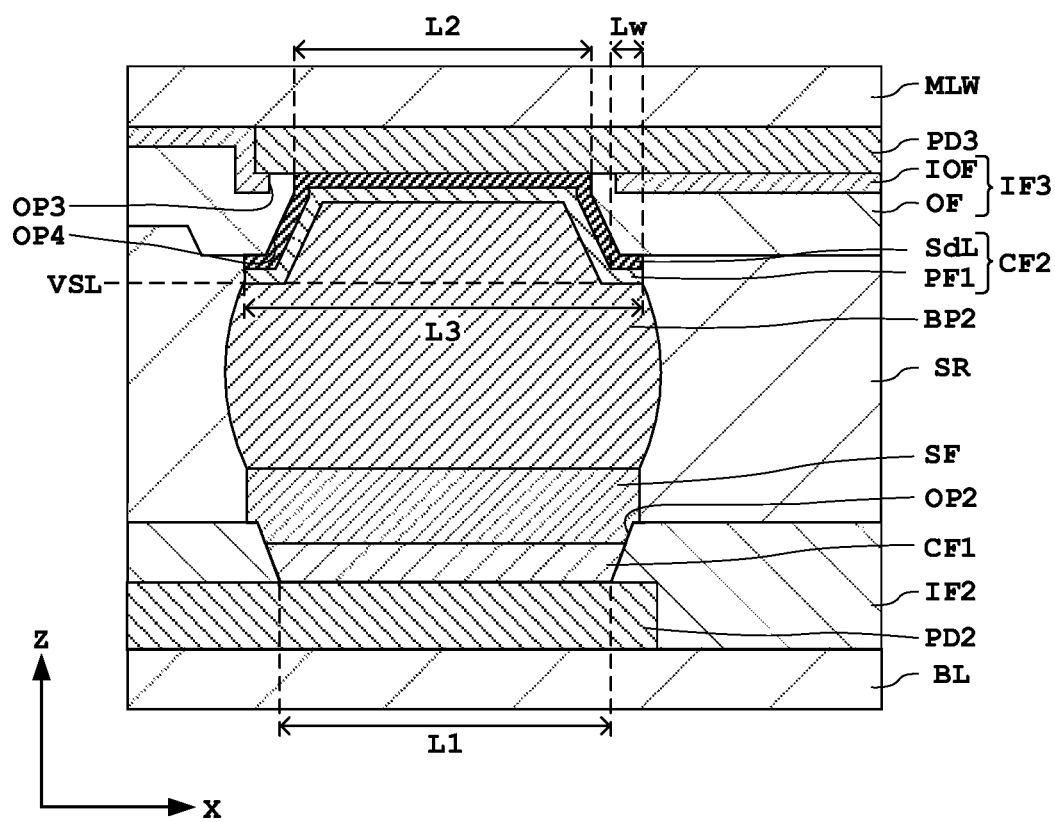
FIG. 3 is a partially enlarged cross-sectional view showing an exemplary configuration of a main portion of the semiconductor device according to the embodiment.

FIG. 1 is a plan view showing an exemplary configuration of a semiconductor device SDs according to a present embodiment. FIG. 2 is a cross-sectional view showing an exemplary the configuration of the semiconductor device SD according to the present embodiment. FIG. 2 is a cross-sectional view taken along line A-A of FIG. 1. FIG. 3 is a partially enlarged cross-sectional view showing an exemplary configuration of the main portion of the semiconductor device SD according to the present embodiment. FIG. 3 is a cross-sectional view showing a region indicated by a broken line in FIG. 2.

The semiconductor device SD includes 1) a package substrate PSB, 2) a first solder bump BP1, 3) a semiconductor chip SCP, 4) a sealing resin SR, and 5) a second solder bump BP2. Incidentally, in this specification, a direction from the package substrate PSB toward the semiconductor chip SCP is upward.

1) Packaging Substrate

The package substrate PSB includes a base layer BL, a first electrode pad PD1, a first insulating film IF1, a second electrode pad PD2, a second insulating film IF2, a first conductive film CF1, and a solder film SF.

The base layer BL includes a plurality of insulating layers and a plurality of wiring layers. The base layer BL electrically connects the first electrode pad PD1 and the second electrode pad PD2 with each other through the plurality of wiring layers. The base layer BL has a first lower surface (first surface) and a first upper surface (second surface) located on an opposite side to the first lower surface.

The first electrode pad PD1 is formed on the first lower surface of the base layer BL. The number of the first electrode pad PD1 is not particularly limited, and is, for example, 2 or more. The material of the first electrode pad PD1 is, for example, copper.

The first insulating layer IF1 is formed on the first lower surface of the base layer BL such that the first insulating layer IF1 exposes a portion of a surface of the first electrode pad PD1. A first opening OP1 exposing the portion of the surfaces of the first electrode pad PD1 is formed on the first insulating film IF1. The material of the first insulating film IF1 is not particularly limited as long as the first insulating film IF1 has an insulating property. The material of the first insulating film IF1 is, for example, a resin.

The second pad PD2 is formed on the first upper surface of the base layer BL. The number of the second electrode pad PD2 is not particularly limited, and is, for example, 2 or more. The material of the second electrode pad PD2 is, for example, copper.

The second insulating film IF2 is formed on the first upper surface of the base layer BL such that the second insulating film IF2 exposes a first portion of a surface (upper surface) of the second electrode pad PD2. A second opening OP2 exposing the first portion of the surfaces of the second electrode pad PD2 is formed on the second insulating film IF2.

A size of the second opening OP2 is smaller than a size of the second electrode pad PD2 in plan view. The number of the second opening OP2 is determined in accordance with the number of the second electrode pad PD2. The second opening OP2 is formed at a position corresponding to the second electrode pad PD2.

A planar shape of the second opening OP2 in plan view is not particularly limited as long as the second electrode pad PD2 is exposed from the second insulating film IF2. The planar shape of the second opening OP2, for example, a substantially rectangular shape, a substantially circular shape or a substantially octagonal shape.

The first conductive film CF1, of the second electrode pad PD2, is formed on a portion exposed in the second opening OP2. The first conductive film CF1 may be a single layer film or a laminated film. The material of the first conductive film CF1 is, for example, metal. Examples of such the metal include, for example, nickel, palladium and gold. The first conductive film CF1 is, for example, a laminated film in which a nickel film, a palladium film, and a gold film are formed in this order.

The solder film SF is formed on the first conductive film CF1. It is preferable that a portion of the solder film SF is located outside the second opening OP2. Thus, it is possible to prevent unbonded the second solder bump BP2 (a solder plating ball SB to be described later) and the solder film SF with each other occurs during flip-chip connection. Further, from the viewpoint of preventing shorting after flip-chip connection with adjacent second solder bumps BP2, a thickness of the solder film SF is preferably smaller than a thickness of the second solder bump BP2. Here, the thickness of the solder film SF is a distance between the first conductive film CF1 and the second solder bump BP2 in a facing direction (first direction, Z direction in FIG. 3) of the second electrode pad PD2 and the third electrode pad PD3. In other words, as shown in FIG. 3, the thickness of the solder film SF, in cross-sectional view, is a thickness of a central portion of the solder film SF, the central portion located on the first conductive film CF1.

2) First Solder Bump BP1

The first solder bump BP1 is formed on a portion, of the first electrode pad PD1, exposed in the first opening OP1. The first solder bump BP1 electrically connects, for example, the packaged substrate PSB and a printed substrate (not shown) with each other. The number of the first solder bump BP1 is not particularly limited.

3) Semiconductor Chip

The semiconductor chip SCP includes a semiconductor device. The semiconductor chip SCP is disposed on the package substrate PSB. More specifically, the semiconductor chip SCP is disposed on the package substrate PSB through the second solder bump BP2. The semiconductor chip SCP has a second lower surface (third surface) and a second upper surface (fourth surface) located on opposite side to the second lower surface. In the present embodiment, the second lower surface of the semiconductor chip SCP faces the first upper surface of the package substrate PSB.

The semiconductor chip SCP includes a multilayer wiring MLW, a third electrode pad PD3, a third insulating film IF3 and a second conductive film CF2.

The multilayer wiring MLW is formed of a plurality of wiring layers formed on the semiconductor substrate (not shown). The wiring layer is a layer including an interlayer insulating layer and one or both of a wiring and a via that are formed in the interlayer insulating layer. The via is a conductive member that electrically connects two wiring formed in layers that differ from each other. In the present embodiment, the multilayer wiring MLW is a part located on the second upper surface side than the third electrode pad PD3 in the semiconductor chip SCP. The interlayer insulating layer is, for example, a Low-k film having a relative dielectric constant of 3.0 or less. The Low-k film is, for example, a SiOC film.

The third electrode pad PD3 is formed on the second lower surface side of the semiconductor chip SCP. The third electrode pad PD3 is formed on the multilayer wiring MLW. The third electrode pad PD3 faces the second electrode pad PD2 of the packaged substrate PSB. The third electrode pad PD3 is formed on the second electrode pad PD2 through the second solder bump BP2 in the facing direction (first direction, Z direction in FIG. 3) of the second electrode pad PD2 and the third electrode pad PD3. In other words, the third electrode pad PD3 and the second electrode pad PD2 sandwich the second solder bump BP2. The number of the third electrode pad PD3 is determined in accordance with the number of the second electrode pad PD2. The material of the third electrode pad PD3 is, for example, copper or aluminum.

The third insulating film IF3 is formed on the multilayer wiring MLW such that the third insulating film IF3 exposes a second portion of the surface (lower surface) of the third electrode pad PD3. The third insulating film IF3 may be a single layer film or a laminated film. In the present embodiment, the third insulating film IF3 is a laminated film including an inorganic film IOF and an organic film OF formed on the inorganic film IOF The material of the third insulating film IF3 is not particularly limited as long as the third insulating film IF3 has insulating properties. Examples of the inorganic film IOF include a silicon oxide film, a silicon oxynitride film, a silicon nitride film, a PSG (Phospho-Silicate Glass) film, and a stacked film thereof. Examples of the organic film OF include a polyimide film. The third insulating film IF3 may include either one of the inorganic film IOF and the organic film OF An opening is formed on the third insulating film IF3 exposing the second portion of the surface of the third electrode pad PD3. More specifically, a third opening OP3 is formed on the inorganic film IOF A fourth opening OP4 is formed on the organic film OF. The fourth opening OP4 continues with the third opening OP3. The third opening OP3 and the fourth opening OP4, in plan view, overlap with each other. A size of the third opening OP3 and a size of the fourth opening OP4 may be the same or different from each other. In the present embodiment, the size of third opening OP3 is greater than the size of the fourth opening OP4 in plan view. That is, the third opening OP3, in a plan view, overlaps with an entire of the fourth opening OP4. This prevents stresses generated by differences in thermal expansion coefficients between the package substrate PSB and the semiconductor chip SCP from acting directly on the inorganic film IOF through the second conductive film CF2. As a result, it is possible to prevent the inorganic film IOF from cracking.

The size of third opening OP3 and the size of the fourth opening OP4, in plan view, is less than the size of the third electrode pad PD3. The third opening OP3 and the fourth opening OP4 overlap with third pad PD3 in plan view.

A planar shape of the third opening OP3 is not particularly limited as long as the third electrode pad PD3 is exposed from the third insulating film. The planar shape of the third opening OP3, for example, a substantially rectangular shape or a substantially circular shape. Examples of the planar shape of the fourth opening OP4 is the same.

An opening width of a top portion of the fourth opening OP4 is preferably greater than an opening width of a bottom portion of the fourth opening OP4. Thus, the second conductive film CF2 is easily uniformly formed on an inner surface of the fourth opening OP4. Incidentally, the top portion of the fourth opening OP4, of the fourth opening OP4, is a portion located on an open end side of the fourth opening OP4.

The second conductive film CF2 is formed on the second portion, of the surface of the third electrode pad PD3, exposed in the fourth opening OP4, an inner surface of the third insulating film IF3, and a surface of the third insulating film IF3. In the present embodiment, the second conductive film CF2 is formed on the portion of the surface, of the third electrode pad PD3, exposed from the fourth opening OP4, the inner surface of the organic film OF, and the surface (lower surface) of the organic film OF.

As shown in FIG. 3, in a cross section passing through the second electrode pad PD2, the second solder bump BP2, and the third electrode pad PD3, a length of the portion located on the surface (lower surface) of third insulating film IF3, of second conductive film CF2, is defined as Lw. From the viewpoint of alleviating the stress in the vicinity of the third electrode pad PD3 due to the difference in thermal expansion coefficients between the semiconductor chip SCP, the packages substrate PSB and the second solder bump BP2, it is preferable that a length of the second portion exposed in the fourth opening OP4 (second length L2 to be described later), of the third electrode pad PD3, is small. That is, it is preferable that the Lw is large. Thus, it is possible to suppress cracks that may occur in the vicinity of third electrode pad PD3 in the second solder bump BP2. From such viewpoint, it is preferable that the length Lw is 5 μm or more.

Furthermore, if the length Lw is too small, when the forming position of the second conductive film CF2 is shifted, the third electrode pad PD3 is easily exposed. In addition, from the viewpoint of suppressing peeling of the second conductive film CF2 from the organic film OF, it is preferable that the Lw is large. From such viewpoint, it is preferable that the length Lw is 5 μm or more.

The second conductive film CF2 may be a single layer film or a laminated film. In the present embodiment, the second conductive film CF2 is a laminated film including a seed layer SdL and a first plated film PF1. The first plating film PF1 is formed on the seed layer SdL. The seed layer SdL is, for example, a laminated film including a Ti film and a Cu film. The Cu film is formed on the Ti film. The material of the first plating film PF1 is, for example, a metal. The metal is, for example, nickel.

4) Second Solder Bump BP2

The second solder bump BP2 electrically connects the package substrate PSB and the semiconductor chip SCP with each other. The second solder bump BP2 is formed between the second portion, of the third electrode pad PD3, exposed in the fourth opening OP4 and the first portion, of the second electrode pad PD2, exposed in the first opening OP2. The number of the second solder bump BP2 is determined in accordance with the number of the second electrode pad PD2 and the number of the third electrode pad PD3. A pitch of the two second solder bumps BP2 adjacent with each other are preferably 150 μm or less. This allows the semiconductor device SD to be miniaturized.

5) Sealing Resin SR

The sealing resin SR is formed between the package substrate PSB and the semiconductor chip SCP. The sealing resin SR seals and protects a first connection part between the second solder bump BP2 and the second electrode pad PD2 and a second connection part of the second solder bump BP2 and the third electrode pad PD3. The sealing resin SR also functions as a buffer material for reducing stresses applied to the first connection part and the second connection part. The material of the sealing resin SR is not particularly limited as long as the above function can be obtained. The material of the sealing resin SR is, for example, a resin such as an epoxy resin and a silicone resin. The sealing resin SR may include a filler such as silica.

Features of Embodiments

Examples of features of the semiconductor device SD according to the present embodiment will be described below. As shown in FIG. 3, a first length of the first portion, of the surface (upper surface) of the second electrode pad PD2, exposed in second opening OP2 is defined as L1, and a second length, of the second portion of the surface (lower surface) of third electrode pad PD3, exposed in the fourth opening OP4 is defined as L2. In a cross section passing through the second electrode pad PD2, the second solder bump BP2, and the third electrode pad PD3, L2/L1 is 0.63 or more in the second direction (X direction) perpendicular to the facing direction (first direction, Z direction) of the second electrode pad PD2 and the third electrode pad PD3. Hereinafter, as described, since the L2/L1 is 0.63 or more, it is possible to reduce the lifetime variation of the semiconductor device SD while realizing miniaturization of the semiconductor device SD.

First, generally, when a current is supplied to third electrode pad PD3 via the second solder bump BP2, the smaller the size of the fourth opening OP4 (the L2), the current density in the fourth opening OP4 is increased. The greater the current density, the greater the Joule heat generated. As a consequence, a void is generated in the second solder bump BP2 due to the synergistic effect of current density and Joule heat. At this instance, the concentration degree of the current varies depending on the size of the fourth opening OP4 (the L2), the thickness of the second conductive film CF2, the manufacturing variation of the semiconductor device SD, and the like. For this reason, generally, the lifetime variation of a semiconductor device may increase. If the lifetime variation is large, there is a problem that the lifetime in the low cumulative failure probability range which determines the reliability of the product becomes short. On the other hand, by increasing the size of the second opening OP2 and the size of the fourth opening OP4, for example by enlarging the second solder bump BP2, by reducing the current density, the lifetime variation is also conceivable way to improve the average lifetime as it is. However, this is not preferable because the semiconductor device SD become larger. Therefore, in present embodiment, the second opening OP2, the third opening OP3, and the fourth opening OP4 are formed so that L2/L1 is 0.63 or more. Thus, to alleviate the current concentration in the fourth opening OP4. Consequently, the lifetime variation of the semiconductor device SD can be reduced. As a consequence, there is no need to enlarge the second solder bump BP2 to mitigate current concentration. Therefore, miniaturization of the semiconductor device SD can also be realized.

The L1 and the L2 are appropriately set in accordance with an amount of current supplied and a size of the semiconductor device SD. From the viewpoint of increasing the amount of current that can be supplied, it is preferable that L1 and L2 are large. From the viewpoint of reducing the size of semiconductor device SD, it is preferable that L1 and L2 are small. The L1 is preferably 80 μm or more and 85 μm or less. The L2 is preferably 55 μm or more and 60 μm or less.

(Reference Experiment)

Figure 4:
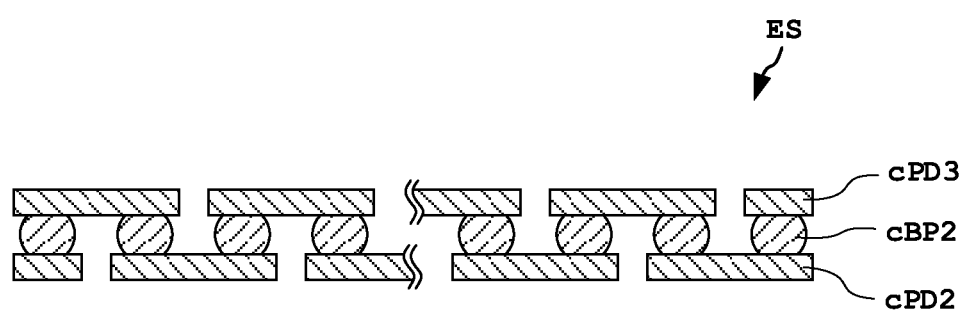
FIG. 4 is a cross-sectional view showing a configuration of an evaluation sample in a reference experiment.

Reference experiment was carried out to confirm the effectiveness obtained by the above features of the semiconductor device SD. FIG. 4 is a cross-sectional view showing a configuration of the evaluation sample ES in the reference experiment.

The evaluation sample ES includes a plurality of second electrode pads cPD2, a plurality of second solder bumps cBP2, and a plurality of third electrode pads cPD3. The second electrode pad cPD2 corresponds to the second electrode pad PD2 of the packaged substrate PSB. The second solder bump cBP corresponds to the second solder bump BP2. The third electrode pad cPD3 corresponds to the third electrode pad PD3 of the semiconductor chip SCP. As shown in FIG. 4, in the evaluation sample ES, the plurality of second electrode pads cPD2 and the plurality of third electrode pads cPD3 are connected in series to each other through the plurality of second solder bumps cBP2.

In this reference experiment, as shown in Table 1 described later, the L1 and the L2 were changed to prepare evaluation samples 1 to 5, respectively. The evaluation samples 1 to 5 were evaluated for lifetime variation σ, mean failure lifetime $t_{50}$, and failure modes, respectively.

In this reference experiment, the temperature around the evaluation sample ES was set to 150° C. to 175° C. The test current was supplied to the evaluation samples ES so that a current of 180 mA to 500 mA per the second solder bump cBP2 flowed. In this state, the resistance value of the evaluation sample ES was measured until a predetermined resistance value. Then, based on the measured results, the lifetime variation (σ) and the mean failure lifetime $t_{50}$ of the evaluated sampled ES are evaluated.

The failure mode of the evaluation sample ES was evaluated based on the following criteria.

Up-Stream Mode: A void was generated in the vicinity of the second electrode pad cPD2, of the second solder bump cBP2. This failure mode occurs when the test current flows from the third electrode pad PD3 toward the second electrode pad PD2.

Down-Stream modes: A void was generated in the vicinity of the third electrode pad cPD3, of the second solder bump cBP2. This failure mode occurs when the test current flows from the second electrode pad PD2 toward the third electrode pad PD3.

The lifetime characteristics of the evaluation samples 1 to 5 were comprehensively evaluated based on the following evaluation criteria. The threshold value of σ, for example, in the semiconductor device SD for vehicle is a value set from the viewpoint of practical use.

A: σ was 0.6 or less, and the failure mode was Up-Stream mode.

B1: Although σ was 0.6 or less, the failure mode was the Down-Stream mode.

B2: σ was greater than 0.6 and the failure mode was the Down-Stream mode.

Table 1 shows the evaluation sample No., L1, L2, L2/L1, lifetime variation σ, mean failure lifetime $t_{50}$, and failure mode.

TABLE 1

| No. | L1 [μm] | L2 [μm] | L2/L1 | σ | $t_{50}$ [arb. unit] | Failure mode | Evaluation |
|---|---|---|---|---|---|---|---|
| 1 | 85 | 70 | 0.82 | 0.35 | 349.4 | Up-Stream | A |
| 2 | 85 | 60 | 0.71 | 0.42 | 375.9 | Up-Stream | A |
| 3 | 80 | 50 | 0.63 | 0.40 | 411.9 | Up-Stream | A |
| 4 | 85 | 50 | 0.59 | 0.26 | 241.0 | Down-Stream | B1 |
| 5 | 80 | 30 | 0.38 | 1.01 | 425.8 | Down-Stream | B2 |

As shown in Table 1, the lifetime variation σ was sufficiently suppressed and the failure mode was Up-Stream mode for the evaluation samples 1 to 3. This is considered to be caused by suppressing current concentration in the vicinity of the third electrode pad PD3 because L2/L1 is 0.63 or more.

In the evaluation sample 4, the lifetime variation σ was suppressed, but the failure mode was Down-Stream mode. This is considered to be because L2/L1 is less than 0.63. As described above, the failure mode is a Down-Stream mode, it means that a location where the void occurs in the second solder bump cBP2 is in the vicinity of the third electrode pad cPD3. Of the second solder bump cBP2, a portion located in the vicinity of the third electrode pad cPD3 is smaller flatness, the current concentration is likely to occur. Therefore, when the failure mode is Down-Stream mode, the lifetime variation σ is likely to vary as compared with when the failure mode is Up-Stream mode. Although the lifetime variation σ of the sample 4 was also small in this reference experiment, depending on the conditions such as the thickness of the second conductive film CF2, the lifetime variation σ may vary.

In the evaluation sample 5, the lifetime variation σ was insufficient and the failure mode was Down-Stream mode. This is considered to be because the L2/L1 is further reduced.

Other Features of the Embodiment

As shown in FIG. 3, a third length of a third portion of the second solder bump PD2, the third portion located on a virtual straight line VSL extending on a surface of the second conductive film CF2 (a portion located outside the fourth opening OP4), in a cross section passing through the second electrode pad BP2, the second solder bump BP2, and the third electrode pad PD3, is defined as L3. The virtual straight line VSL is along the surface of the second conductive film CF2. At this instance, L3/L1 is preferably 0.97 or more and 1.07 or less. If the L3/L1 is less than 0.96, the stress to Low-k film constituting the multilayer wiring MLW is increased, there is a tendency that the reliability of the semiconductor device SD is reduced. When the L3/L1 is 1.07 or more, there is a tendency that stresses concentrate on the second solder bump BP2, and then, the reliability of the semiconductor device SD is reduced due to cracks generated in the second solder bump BP2. From such viewpoint, the L3/L1 is preferably 0.97 or more and 1.07 or less.

From the viewpoint of miniaturization of the semiconductor chip SCP, it is preferable that the L3 is small. On the other hand, from the viewpoint of increasing the amount of current that can be supplied, it is preferable that the L3 is large. From such viewpoint, it is preferable that the L3 is 80 μm or more and 90 μm or less.

(Method of Manufacturing Semiconductor Device)

Next, an exemplary method of manufacturing the semiconductor device SD according to the present embodiment will be described. FIGS. 5 to 16 are cross-sectional views showing exemplary step included in the method of manufacturing the semiconductor device SD.

The method of manufacturing the semiconductor device SD according to the embodiment, (1) providing a semiconductor wafer SW, (2) forming the third electrode pad PD3, (3) forming the third insulating film IF3, (4) forming the second conductive film CF2 and the solder plating ball SB, (5) providing the package substrate PSB, (6) flip-chip connecting, (7) sealing, and (8) forming the first solder bump BP1.

(1) Providing of a Semiconductor Wafer SW

Figure 5:
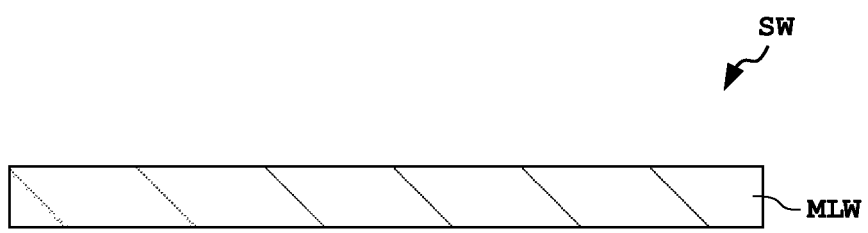
FIG. 5 is a cross-sectional view showing an exemplary step included in a method of manufacturing the semiconductor device according to the embodiment.

First, as shown in FIG. 5, a semiconductor wafer SW including a multilayer wiring MLW is provided. The multilayer wiring MLW is formed by a known method as a method of forming a multilayer wiring.

(2) Forming the Third Electrode Pad PD3

Figure 6:
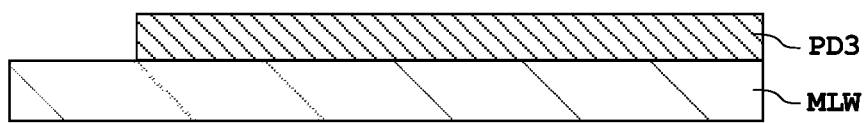
FIG. 6 is a cross-sectional view showing an exemplary step included in the method of manufacturing the semiconductor device according to the embodiment.

Subsequently, as shown in FIG. 6, the third electrode pad PD3 is formed on the multilayer wiring MLW. The third electrode pad PD3 is formed, for example, by forming a conductive film on the multilayer wiring MLW, and then, patterning the conductive film into a desired shape. A method of forming the conductive film is, for example, a sputtering method. A patterning of the conductive film is performed, for example, by a photolithography method and an etching method.

(3) Forming the Third Insulating Film IF3

Figure 7:
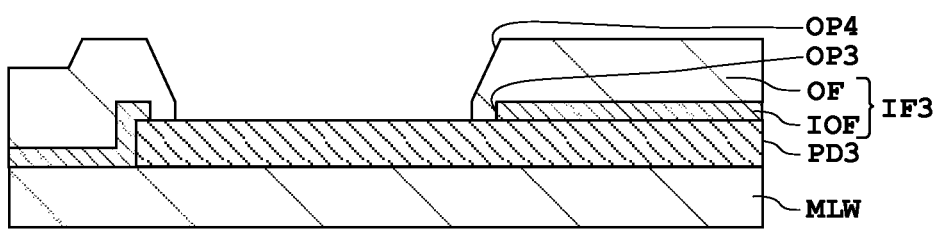
FIG. 7 is a cross-sectional view showing an exemplary step included in the method of manufacturing the semiconductor device according to the embodiment.

Subsequently, as shown in FIG. 7, the third insulating film IF3 is formed on the multilayer wiring MLW. An opening is formed on the third insulating film IF3 to expose the portion of the surfaces of third electrode pad PD3. The third insulating film IF3 is formed, for example, by the following methods. First, the inorganic film IOF is formed on the multilayer wiring MLW so as to cover the third electrode pad PD3, and then, the third opening OP3 is formed in the insulating film IOF. Subsequently, the organic film OF is formed on the portion, of the third electrode pad PD3, exposed in the third opening OP3, and is formed on the inorganic film IOF Subsequently, the fourth opening OP4 is formed on the organic film OF to expose the portion of the surface of the third pad PD3. A method of forming the insulating film IOF is, for example, a CVD method. The organic film OF is formed by coating a precursor solution of a photosensitive polyimide on an inorganic film IOF and an third electrode pad PD3 exposed in the third opening OP3 to form a coating film, and then curing the coating film. Form of the third opening OP3 and the fourth opening OP4, for example, is performed by a photolithography method and an etching method.

(4) Forming the Second Conductive Film CF2 and the Solder Plating Ball SB

The second conductive film CF2 and the solder plating ball SB are then formed as shown in FIGS. 8-12. This step includes (4-1) forming the seed layer SdL, (4-2) lithography, (4-3) plating, (4-4) removing the seed layer SdL and a resist layer RL, and (4-5) reflow.

(4-1) Formation the Seed Layer SdL

Figure 8:
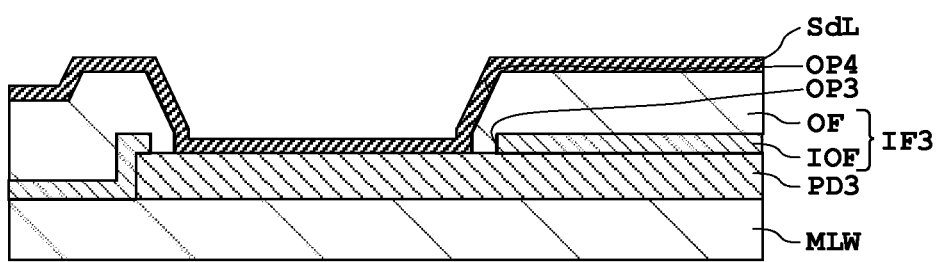
FIG. 8 is a cross-sectional view showing an exemplary step included in the method of manufacturing the semiconductor device according to the embodiment.

As shown in FIG. 8, the seed layer SdL is formed on a portion, of the surface of third electrode pad PD3, exposed in the fourth opening OP4, the inner surface of the organic layer OF, and the surface of the organic layer OF. The seed layer is formed, for example, by a sputtering method. The seed layer is, for example, a laminated film in which the Ti film and the Cu film are laminated in this order.

(4-2) Lithography

Figure 9:
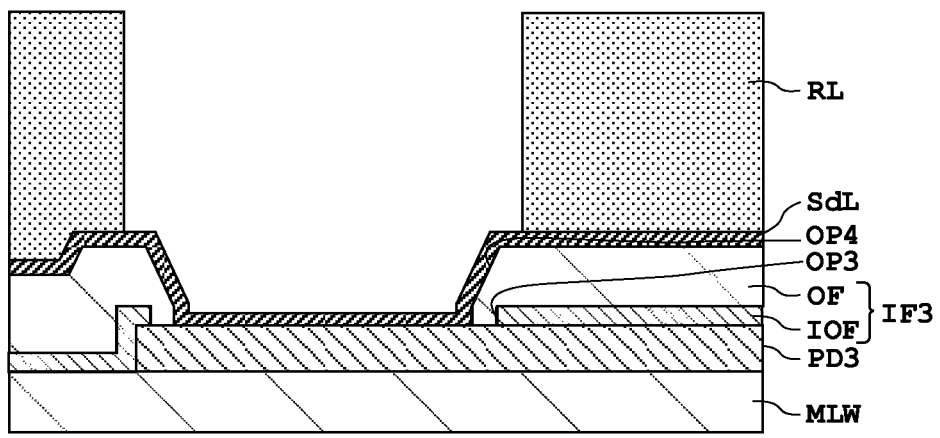
FIG. 9 is a cross-sectional view showing an exemplary step included in the method of manufacturing the semiconductor device according to the embodiment.

Subsequently, as shown in FIG. 9, a resist layer RL is formed on the seed layer SdL by lithography method. The step of forming the resist layer RL includes a applying a photoresist material, an exposing, and a developing. The resist layer RL, in the plating step, defines a plating region in which a plating layer is formed. The resist layer RL, an opening is formed at a position corresponding to the plating region. A portion of the seed layer SdL is exposed in the opening.

(4-3) Plating

Figure 10:
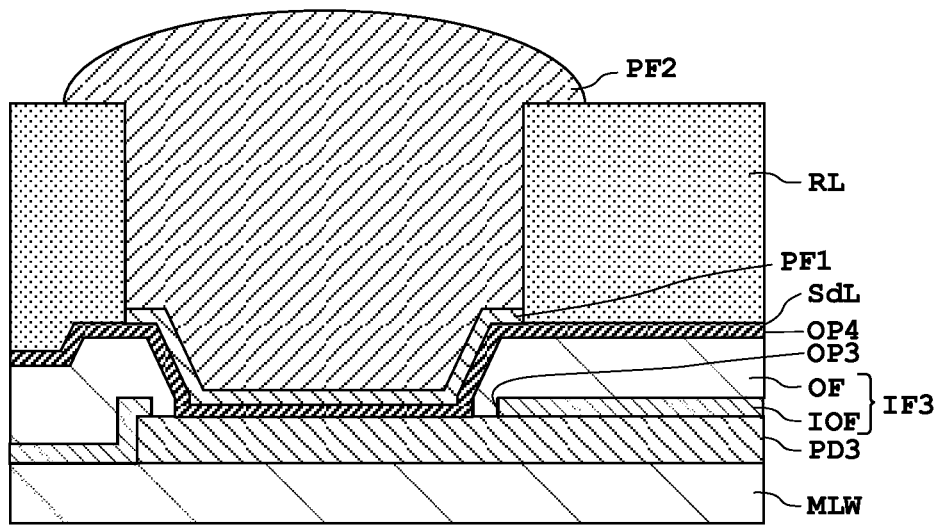
FIG. 10 is a cross-sectional view showing an exemplary step included in the method of manufacturing the semiconductor device according to the embodiment.

Subsequently, as shown in FIG. 10, a first plating film PF1 and a second plating film PF2 are formed in this order on a region, of the seed layer SdL, exposed from the resist layer RL by plating method. The first plating film PF1 is, for example, a Ni film. The second plating film PF2 is, for example, a SnAg film.

(4-4) Removing the Seed Layer SdL and the Resist Layer RL

Figure 11:
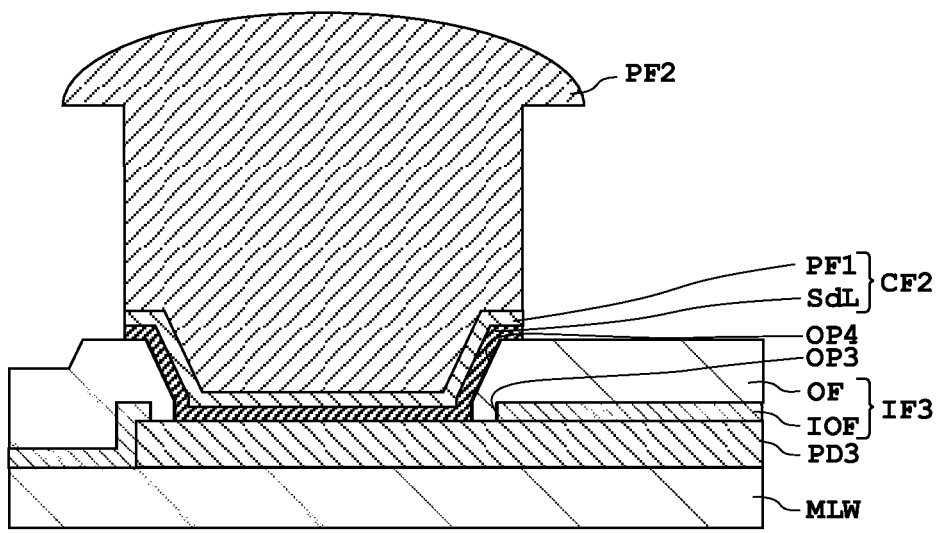
FIG. 11 is a cross-sectional view showing an exemplary step included in the method of manufacturing the semiconductor device according to the embodiment.

Subsequently, as shown in FIG. 11, the seed layer SdL and the resist layer RL are removed. The method of removing the seed layer SdL and the resist layer RL is, for example, a wet etching method. The portion, of the seed layer SdL, exposed from the first plating film PF1 is removed from the seed layer SdL. As a result, the second conductive film CF2 constituted by the seed layer SdL and the first plating film PF1 is formed.

(4-5) Reflow

Figure 12:
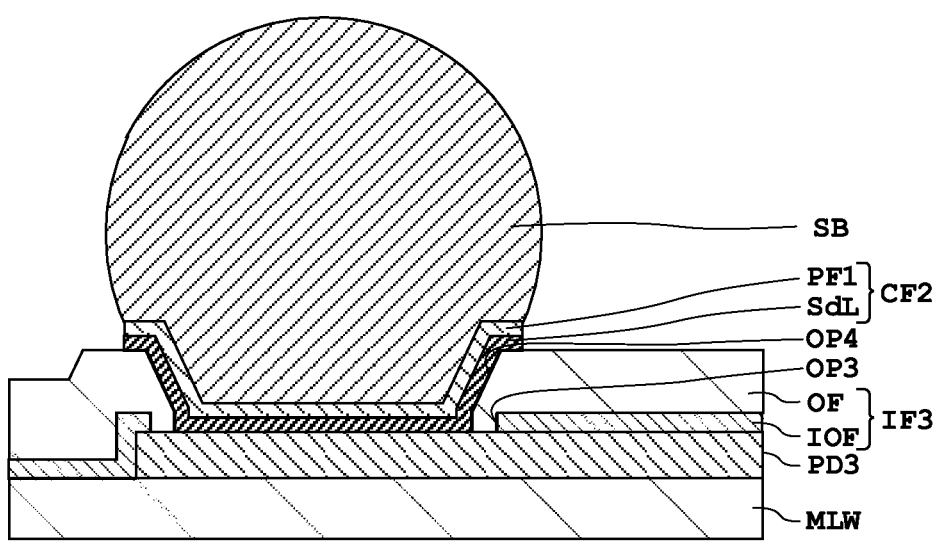
FIG. 12 is a cross-sectional view showing an exemplary step included in the method of manufacturing the semiconductor device according to the embodiment.

Subsequently, as shown in FIG. 12, a heat treatment is applied to the second plating film PF2. Thus, a solder plating ball SB having a substantially spherical shape is formed on the second conductive film CF2.

(5) Providing the Packaged Substrate PSB

Figure 13:
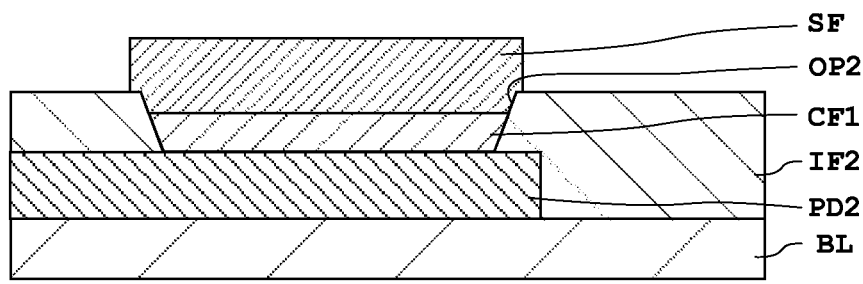
FIG. 13 is a cross-sectional view showing an exemplary step included in the method of manufacturing the semiconductor device according to the embodiment.

Subsequently, the packaged substrate PSB is prepared, as shown in FIG. 13. First, for example, a commercially available package substrate is provided. The package substrate includes the base layer BL, the first electrode pad PD1, the first insulating film IF1, the second electrode pad PD2, the second insulating film IF2, and the first conductive film CF1. Subsequently, by plating, the solder film SF is formed on the second electrode pad PD2 through the first conductive film CF1.

(6) Flip-Chip Connection

Figure 14:
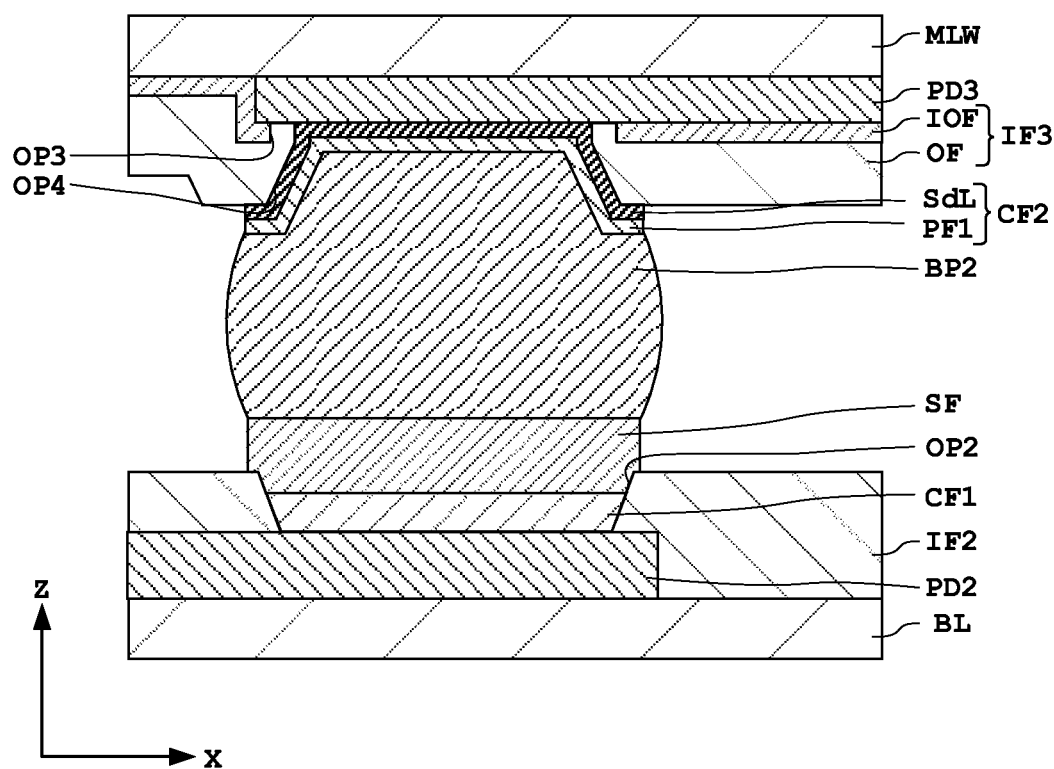
FIG. 14 is a cross-sectional view showing an exemplary step included in the method of manufacturing the semiconductor device according to the embodiment.

Subsequently, the semiconductor chip SCP and the package substrate PSB are flip-chip connected as shown in FIG. 14. Specifically, the semiconductor chip SCP id disposed on the package substrate PSB such that the solder plating ball SB is sandwiched between the second electrode pad PD2 and the third electrode pad PD3 through the first conductive film CF1 and the second conductive film CF2. Subsequently, the heat treatment is performed with the semiconductor chip SCP disposed on the package substrate PSB. Thus, the solder plating ball SB and the solder film SF is melted, integrated with each other as a single member. As a consequence, the semiconductor chip SCP and the package substrate PSB are connected with each other through the second solder bump BP2.

(7) Sealing

Figure 15:
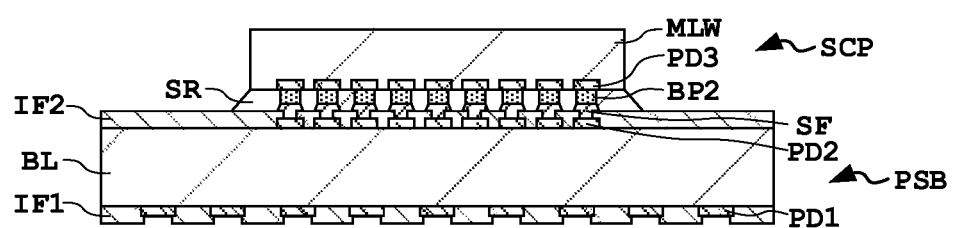
FIG. 15 is a cross-sectional view showing an exemplary step included in the method of manufacturing the semiconductor device according to the embodiment.

Subsequently, as shown in FIG. 15, the sealing resin SR is formed between the semiconductor chip SCP and the package substrate PSB. Thus, the second solder bump BP2 is sealed. For example, the sealing resin SR is formed between the semiconductor chip SCP and the package substrate PSB by thermally curing the thermosetting resin after supplying the thermosetting resin.

(8) Forming the First Solder Bump BP1

Figure 16:
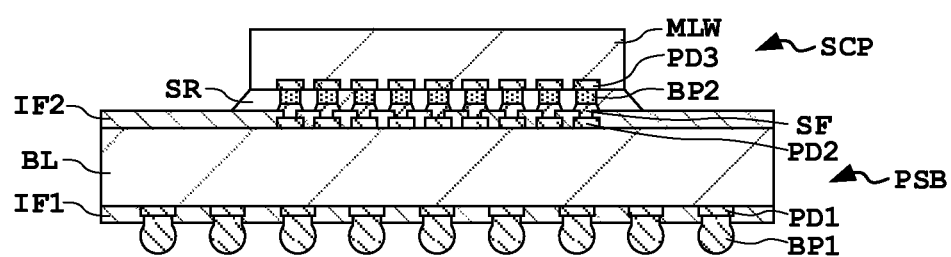
FIG. 16 is a cross-sectional view showing an exemplary step included in the method of manufacturing the semiconductor device according to the embodiment.

Subsequently, as shown in FIG. 16, the first solder bump BP1 is formed on the first electrode pad PD1. The method of forming the first solder bump BP1 is, for example, the same as the method of forming the solder plating ball SB.

The semiconductor device SD according to the present embodiment is manufactured by the manufacturing method.

Effect

In the semiconductor device SD according to the present embodiment, the second opening OP2, the third opening OP3, and the fourth opening OP4 are formed such that L2/L1 is 0.63 or more. Thus, it is possible to reduce the lifetime variation of the semiconductor device SD while realizing the miniaturization of semiconductor device SD. As a result, the reliability of the semiconductor device SD can be improved.

It should be noted that the present invention is not limited to the above embodiments can be made without departing from the gist thereof.

In addition, even when a specific numerical value example is described, it may be a numerical value exceeding the specific numerical value, or may be a numerical value less than the specific numerical value, except when it is theoretically obviously limited to the numerical value. In addition, the component means "B containing A as a main component" or the like, and the mode containing other components is not excluded.

What is claimed is:

1. A semiconductor device comprising:
   a package substrate;
   a semiconductor chip disposed on the package substrate; and
   a solder bump electrically connecting the package substrate and the semiconductor chip with each other,
   wherein the package substrate comprises:
   a first electrode pad; and
   a first insulating film formed such that the first insulating film exposes a first portion of a surface of the first electrode pad,
   wherein the semiconductor chip comprises:
   a second electrode pad; and
   a second insulating film formed such that the second insulating film exposes a second portion of a surface of the second electrode pad,
   wherein the semiconductor device further comprises a conductive film formed on the second portion of the second electrode pad, an inner surface of the second insulating layer, and a surface of the second insulating layer,
   wherein the second electrode pad is formed on the first electrode pad through the solder bump, and
   wherein, in a cross section passing through the first electrode pad, the solder bump and the second electrode pad, L2/L1 is 0.63 or more when a first length of the first portion of the first electrode pad and a second length of the second portion of the second electrode pad are defined as L1 and L2, respectively.

2. The semiconductor device according to claim 1, wherein, in the cross section, L3/L1 is 0.97 or more and 1.07 or less when a third length of a third portion of the solder bump, the third portion located on a virtual straight line extending on a surface of the conductive film, is defined as L3.

3. The semiconductor device according to claim 1, wherein the second insulating layer comprises:
an inorganic film having a first opening; and
an organic film formed on the inorganic film and having a second opening continuing with the first opening, and
wherein, in plan view, the first opening and the second opening overlap with each other.

4. The semiconductor device according to claim 3, wherein, in plan view, a size of the first opening is greater than a size of the second opening, and
wherein the organic film is formed on an inner surface of the inorganic film and a surface of the inorganic film.

5. The semiconductor device according to claim 4, wherein an opening width of a top portion of the second opening is greater than an opening width of a bottom portion of the second opening.

6. The semiconductor device according to claim 1, wherein the first length is at least 80 μm but not more than 85 μm.

7. A semiconductor device comprising:
a package substrate;
a semiconductor chip disposed on the package substrate; and
a solder bump electrically connecting the package substrate and the semiconductor chip with each other,
wherein the package substrate comprises:
a first electrode pad; and
a first insulating film formed such that the first insulating film exposes a first portion of a surface of the first electrode pad,
wherein the semiconductor chip comprises:
a second electrode pad; and
a second insulating film formed such that the second insulating film exposes a second portion of a surface of the second electrode pad,
wherein the second electrode pad is formed on the first electrode pad through the solder bump,
wherein the second insulating layer comprises:
an inorganic film having a first opening; and
an organic film formed on the inorganic film and having a second opening continuing with the first opening,
wherein, in plan view, the first opening and the second opening overlap with each other, and
wherein, in a cross section passing through the first electrode pad, the solder bump and the second electrode pad, L2/L1 is 0.63 or more when a first length of the first portion of the first electrode pad and a second length of the second portion of the second electrode pad are defined as L1 and L2, respectively.

8. The semiconductor device according to claim 7, comprising a conductive film formed on the second portion of the second electrode pad, an inner surface of the second insulating layer, and a surface of the second insulating layer.

9. The semiconductor device according to claim 8, wherein, in the cross section, L3/L1 is 0.97 or more and 1.07 or less when a third length of a third portion of the solder bump, the third portion located on a virtual straight line extending on a surface of the conductive film, is defined as L3.

10. The semiconductor device according to claim 7, wherein, in plan view, a size of the first opening is greater than a size of the second opening, and
wherein the organic film is formed on an inner surface of the inorganic film and a surface of the inorganic film.

11. The semiconductor device according to claim 10, wherein an opening width of a top portion of the second opening is greater than an opening width of a bottom portion of the second opening.

12. The semiconductor device according to claim 7, wherein the first length is at least 80 μm but not more than 85 μm.

\* \* \* \* \*